US012562744B2

(12) United States Patent
Savidis et al.

(10) Patent No.: US 12,562,744 B2
(45) Date of Patent: *Feb. 24, 2026

(54) RECONFIGURABLE ARRAY FOR ANALOG APPLICATIONS

(71) Applicant: Drexel University, Philadelphia, PA (US)

(72) Inventors: Ioannis Savidis, Wallingford, PA (US); Ziyi Chen, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 163 days.

This patent is subject to a terminal disclaimer.

(21) Appl. No.: 18/305,718

(22) Filed: Apr. 24, 2023

(65) Prior Publication Data

US 2023/0299775 A1 Sep. 21, 2023

Related U.S. Application Data

(63) Continuation-in-part of application No. 18/184,692, filed on Mar. 16, 2023.

(60) Provisional application No. 63/333,664, filed on Apr. 22, 2022, provisional application No. 63/321,137, filed on Mar. 18, 2022.

(51) Int. Cl.
*H03K 19/17768* (2020.01)
*H03K 19/17728* (2020.01)

(52) U.S. Cl.
CPC . *H03K 19/17768* (2013.01); *H03K 19/17728* (2013.01)

(58) Field of Classification Search
None
See application file for complete search history.

(56) References Cited

U.S. PATENT DOCUMENTS

| | | | | |
|---|---|---|---|---|
| 8,111,097 | B1* | 2/2012 | Kutz | H03K 25/04 |
| | | | | 330/86 |
| 2006/0261846 | A1* | 11/2006 | Twigg | H03K 19/173 |
| | | | | 326/37 |
| 2010/0301897 | A1* | 12/2010 | Heaton | H03K 19/17704 |
| | | | | 326/38 |

OTHER PUBLICATIONS

Chen et al., "Reconfigurable Array for Analog Applications", IEEE Xplore, 39th International Conference on Computer Design, Dec. 2021, 8 pages.
Chen et al. "Reconfigurable Analog Array for Hardware Security", IEEE, International Symposium on Circuits and Systems, Nov. 11, 2022, 5 pages.

* cited by examiner

*Primary Examiner* — Anh Q Tran
(74) *Attorney, Agent, or Firm* — Schott, P.C.

(57) ABSTRACT

In this paper, a novel field-programmable analog array (FPAA) is proposed to secure the intellectual property (IP) of analog and mixed-signal circuits. A obfuscation technique is developed to efficiently mask the topology of both differential mode and single-ended mode analog circuits.

20 Claims, 8 Drawing Sheets

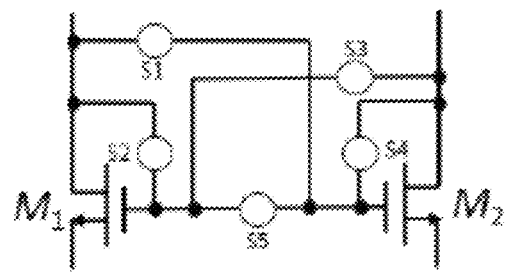
FIG. 2(a)
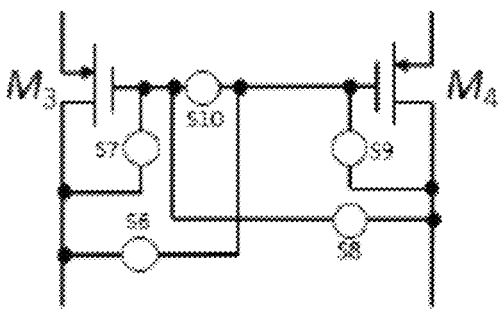
FIG. 2(b)
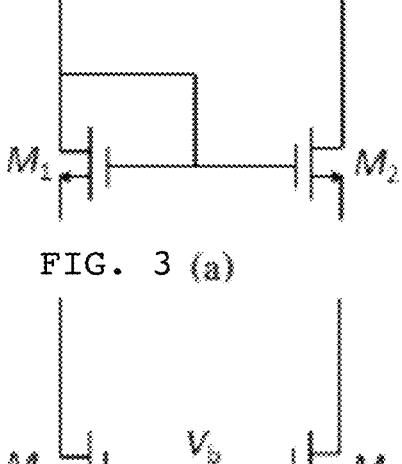
FIG. 3 (a)
FIG. 3(c)
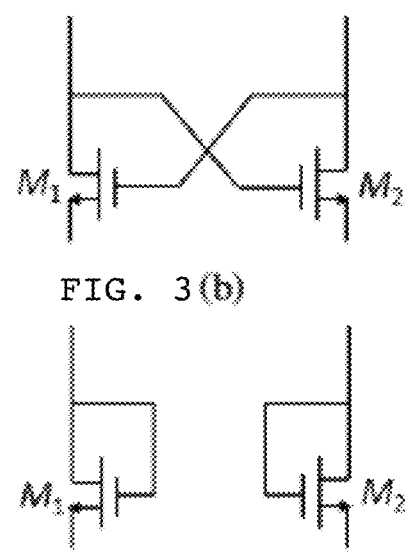
FIG. 3(b)
FIG. 3 (d)

TABLE I

SWITCH CONFIGURATION OF CAB1 AND CAB2 TO IMPLEMENT AN OP AMP, DYNAMIC LATCH, AND CS AMPLIFIER

| CAB type | Configuration Mode | S1 | S2 | S3 | S4 | S5 | S6 | S7 | S8 | S9 | S10/S11 | S12 | S13 | S14 | S15 | S16 | S17/S18 |
|---|---|---|---|---|---|---|---|---|---|---|---|---|---|---|---|---|---|
| CAB1 (Op-Amp) | Current Mirror Load | OFF | OFF | OFF | OFF | OFF | OFF | ON | OFF | OFF | ON | OFF | OFF | - | - | - | - | - |
| | Current Source Load | OFF | OFF | OFF | OFF | OFF | OFF | ON | OFF | ON | ON | OFF | OFF | - | - | - | - | - |
| | Current Source Load CMFB | OFF | OFF | OFF | OFF | OFF | ON | OFF | OFF | OFF | ON | OFF | OFF | - | - | - | - | - |
| | Diode-connected Load | OFF | OFF | OFF | OFF | OFF | OFF | OFF | ON | OFF | OFF | OFF | OFF | - | - | - | - | - |
| | Dynamic Latch | OFF | OFF | OFF | OFF | OFF | ON | OFF | OFF | OFF | OFF | OFF | OFF | - | - | - | - | - |
| CAB2 (CS-Amp) | PMOS Current Source Load | OFF | OFF | OFF | OFF | ON | OFF | ON | OFF | OFF | ON | OFF | ON | OFF | OFF | ON | OFF | ON |
| | PMOS Diode-connected Load | OFF | OFF | OFF | OFF | ON | OFF | ON | OFF | OFF | ON | OFF | ON | OFF | OFF | ON | OFF | ON |
| | NMOS Current Source Load | OFF | OFF | OFF | OFF | ON | OFF | ON | OFF | OFF | ON | OFF | ON | OFF | OFF | ON | OFF | ON |

FIG. 7

TABLE II

3-DB BANDWIDTH COMPARISON BETWEEN THE BASELINE AND RECONFIGURABLE AMPLIFIERS

| Implementation | | 3-dB Bandwidth | |
|---|---|---|---|
| | | Reconfigured | Baseline |
| Op-Amp | Current Mirror Load | 387 MHz | 3.2 GHz |
| | Current Source Load | 938 MHz | 4.8 GHz |
| | Current Source Load CMFB | 1.39 GHz | 4.7 GHz |

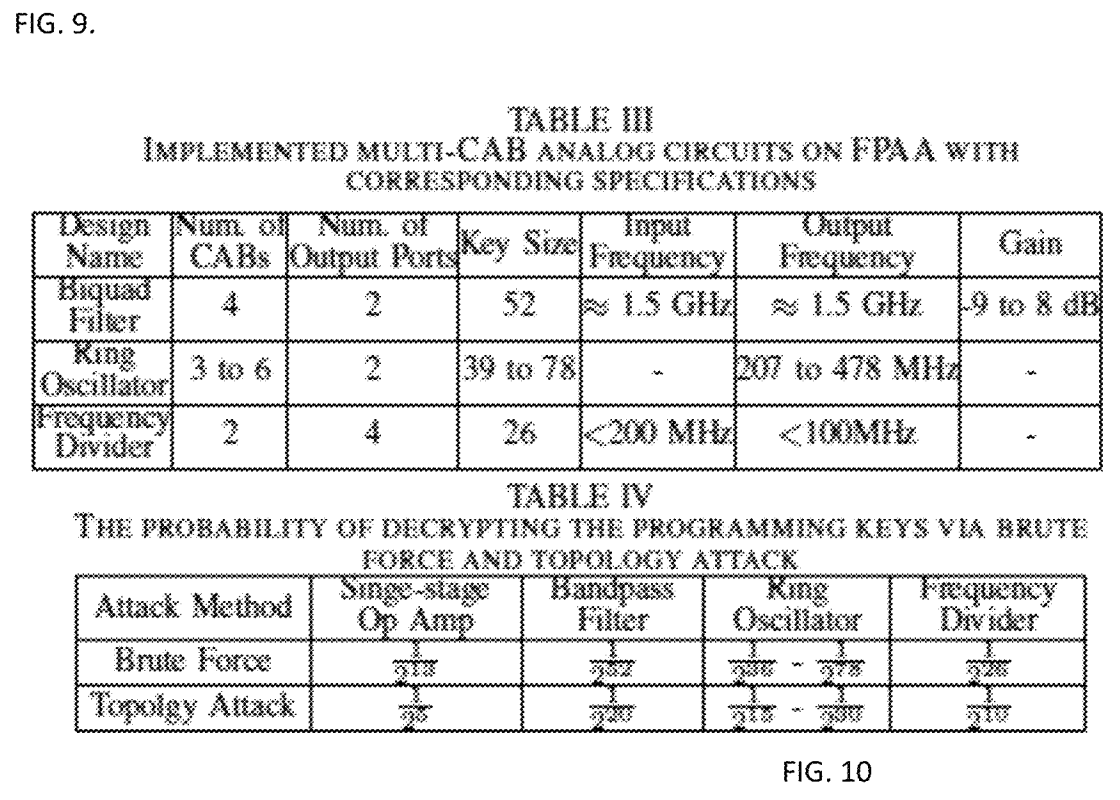

TABLE III

IMPLEMENTED MULTI-CAB ANALOG CIRCUITS ON FPAA WITH CORRESPONDING SPECIFICATIONS

| Design Name | Num. of CABs | Num. of Output Ports | Key Size | Input Frequency | Output Frequency | Gain |
|---|---|---|---|---|---|---|
| Bandpass Filter | 4 | 2 | 52 | ≈ 1.5 GHz | ≈ 1.5 GHz | 9 to 8 dB |
| Ring Oscillator | 3 to 6 | 2 | 39 to 78 | - | 207 to 478 MHz | - |
| Frequency Divider | 2 | 4 | 26 | <200 MHz | <100MHz | - |

TABLE IV

THE PROBABILITY OF DECRYPTING THE PROGRAMMING KEYS VIA BRUTE FORCE AND TOPOLOGY ATTACK

| Attack Method | Single-stage Op Amp | Bandpass Filter | Ring Oscillator | Frequency Divider |
|---|---|---|---|---|
| Brute Force | | | | |
| Topology Attack | | | | |

FIG. 10

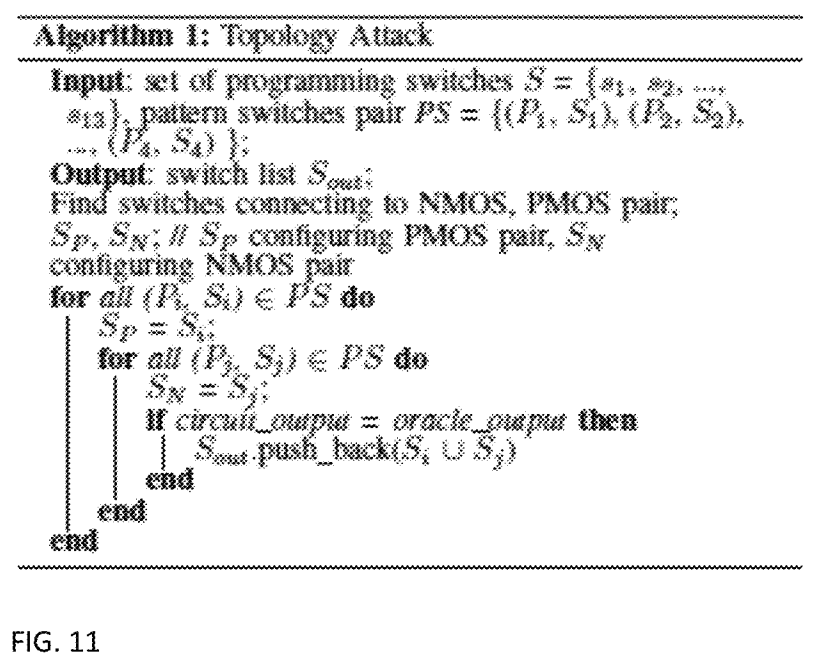

Algorithm 1: Topology Attack

Input: set of programming switches $S = \{s_1, s_2, \ldots\}$, pattern switches pair $PS = \{(P_1, S_1), (P_2, S_2), \ldots (P_N, S_N)\}$.

Output: switch list $S_{out}$
Find switches connecting to NMOS, PMOS pair;
$S_P, S_N$; // $S_P$ configuring PMOS pair, $S_N$ configuring NMOS pair for all $(P_k, S_k) \in PS$ do
   $S_P = S_k$;
   for all $(P_k, S_j) \in PS$ do
      $S_N = S_j$;
      if circuit_output == oracle_output then
         $S_{out} = \text{push\_back}(S_i \cup S_j)$;
      end
   end
end

FIG. 11

RECONFIGURABLE ARRAY FOR ANALOG APPLICATIONS

STATEMENT REGARDING GOVERNMENT SUPPORT

This invention was made with government support under Contract No. CNS-1751032 awarded by the National Science Foundation. The government has certain rights in the invention.

BACKGROUND

1.1 Introduction

Hardware security has drawn greater attention in recent years due to the continuously expanding use of integrated circuits (ICs) and the urgent need to secure the intellectual property (IP) found within ICs. While logic locking has been implemented on digital circuits to protect against IP piracy and counterfeiting, securing analog circuits remains a challenge due to the sensitivity of the circuits to parasitic capacitance and resistance. Existing efforts on securing analog circuits include obfuscating the bias conditions [1], threshold voltage [2], or transistor sizes [3]-[5] of a circuit.

Although obfuscating certain parameters of an analog IC prevents an attacker from directly using stolen IP, the internal architecture and the functionality of the circuit remain vulnerable to an attacker if a reverse engineering attack [6] is executed to retrieve the raw netlist of the design. In order to mask the topology, a novel obfuscation technique is developed that uses a field-programmed analog array (FPAA) to secure the structure of an analog circuit.

Similar to a field-programmable gate array (FPGA), which is programmed to implement different digital logic functions, the FPAA [7], [8] uses routing switches to reconfigure the FPAA fabric into various analog circuits. The programmability of the FPAA is due to the flexibility provided by the individual configurable analog blocks (CABs), and the formation of connections between multiple CABs. Therefore, the FPAA allows for the mapping of simple analog modules into a single CAB, while more complex analog circuits are mapped across multiple CABs. The functionality of the FPAA is unknown prior to programming the routing switches, which implies that the FPAA provides the intended specifications only when the correct programming bitstream is applied.

SUMMARY OF THE EMBODIMENTS

A field-programmable analog array (FPAA) secures the intellectual property (IP) of analog and mixed-signal circuits. An obfuscation technique efficiently masks the topology of both differential mode and single-ended mode analog circuits. The overhead in performance due to the parasitic impedance of the routing switches is analyzed at the internal nodes connected to the programming switches. Advantages of topology obfuscation include the generation of a large search space, an uncorrelated output response, and flexibility in circuit design. The circuits implemented on the FPAA include an op amp with varying loads, a second order biquad filter, a ring-oscillator, and a frequency divider. For circuits requiring a single configurable analog block (CAB) on the FPAA, the 3 dB bandwidth is maintained around 1 GHz, while circuits requiring multiple CABs operate with frequencies between 200 MHz and 1.5 GHz. The security provided by the FPAA fabric is evaluated on both single CAB implementations as well as multi-CAB circuits. Two attack scenarios are considered, a brute force attack and a topology attack. The multi-CAB circuit provides strong security robustness to both attacks with a minimum search space of 226 for the brute force attack and 210 for the topology attack. The FPAA core is implemented in a 65 nm process with an area of 0.1 mm2.

BRIEF DESCRIPTION OF THE DRAWINGS

The figures supplement the below description.

FIGS. 2(a) and 2(b) show schematics of NMOS and PMOS pairs respectively.

FIGS. 3(a), 3(b), 3(c), and 3(d) show possible topologies achieved with a single NMOS transistor pair, which include a current mirror, regeneration loop, current source pair, and diode-connected pair, respectively.

FIG. 7 shows Table I.

FIG. 8 shows Table II.

FIG. 9 shows Table III.

FIG. 10 shows Table IV.

FIG. 11 shows Algorithm 1.

DETAILED DESCRIPTION OF THE EMBODIMENTS

2. Reconfigurable Analog Array for Hardware Security

2.2 Implementation of FPAA Fabric as a Security Measure

Figure 1:
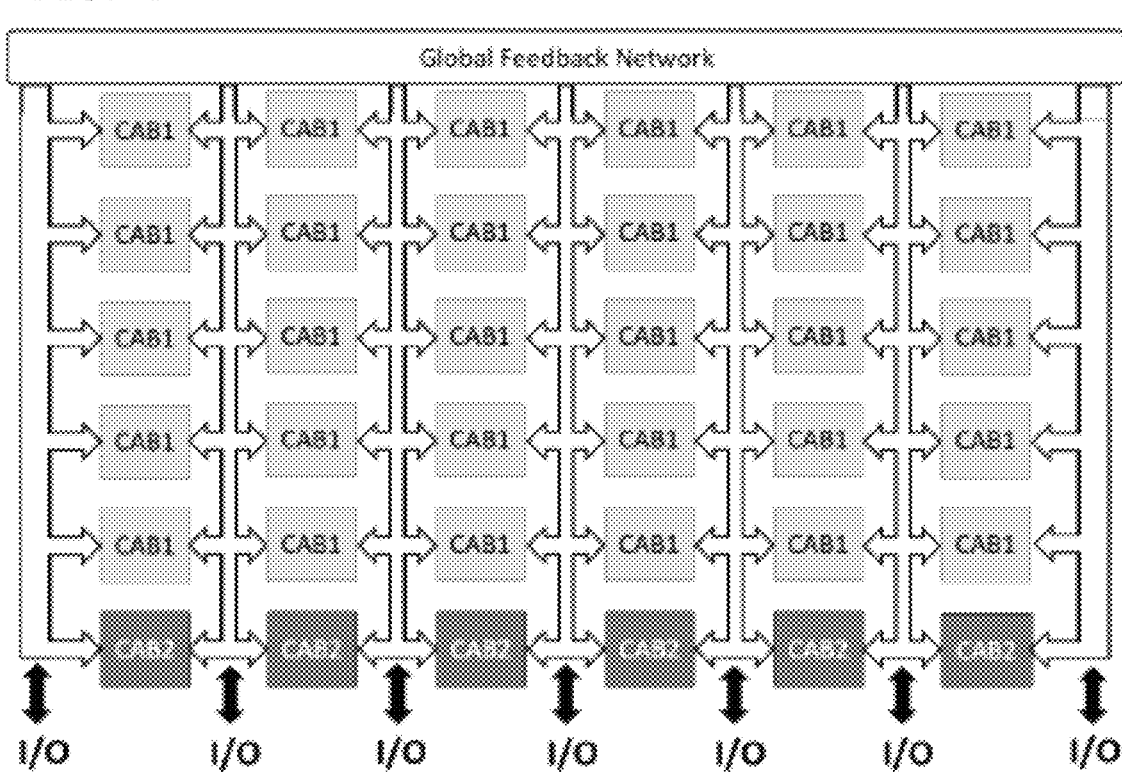
FIG. 1 shows the FPAA Architecture with its core organized into a 6×6 CAB matrix.

The proposed FPAA consists of a 6×6 CAB matrix as shown in FIG. 1, where each column of CABs is directly accessed through seven I/O ports, though different CAB matrixes are possible. There are two different topologies of CABs within the array to facilitate both single-ended and differential mode operation. A global routing network allows positive or negative feedback across multiple CABs to implement more complex analog topologies. In addition, the bandwidth limitation due to the routing switches is reduced by implementing switchless interconnects between CABs.

A global switchless interconnect may be used to connect between CABs. In addition, seven I/O ports, one in each column of the array, may be used to provide direct access to the CABs. A global feedback network is included to allow for the implementation of closed-loop systems. Through the FPAA, an obfuscation technique efficiently masks the transistors and topology of a baseline analog circuit. The technique uses the structure of the FPAA fabric to obfuscate the topologies of the implemented analog circuits.

The effects on the performance of the implemented circuits due to the routing switches has been analyzed by developing parasitic models for different configurations of the fabric. In addition, the trade-off between security and performance is characterized by comparing the circuit specifications of the baseline design of an op amp with a topologically equivalent op amp implemented on the reconfigured FPAA fabric.

2.2.1 Obfuscating the Topology of a Transistor Pair

In order to secure the IP of an analog circuit, a topology obfuscation technique is proposed that masks the connection between two transistors in a generic architecture. As shown in FIGS. 2(a) and 2(b), five switches are used to reconfigure the NMOS or PMOS transistor pair into four different circuit topologies, which include a current-mirror, a regeneration loop, a current source, and a diode-connected pair, as shown in FIGS. 3(a)-3(d). Since differential mode signals are widely used in analog circuits, obfuscating the topology of a transistor pair efficiently secures the internal structure of differential mode topologies. Stacking multiple generic transistor pairs allows for the implementation of more complex analog circuits. Single-ended mode circuits may be implemented by using half of the transistors of the generic transistor pair.

2.2.2 CAB Architecture

Figure 4A:
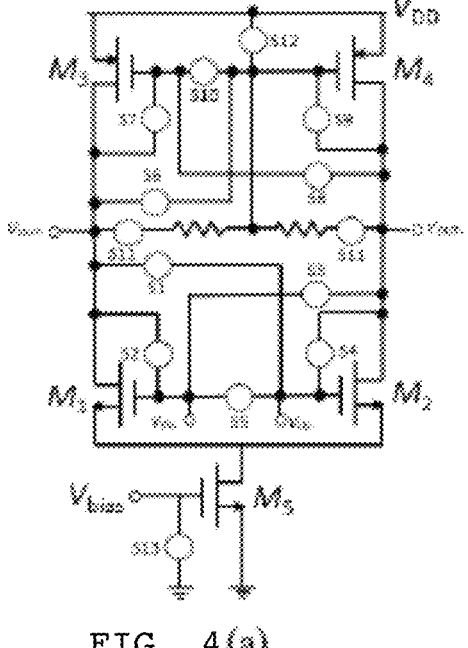
FIG. 4(a) shows a schematic of a differential mode CAB (CAB1) and FIG. 4(b) shows a single-ended mode CAB (CAB2).
Figure 4B:
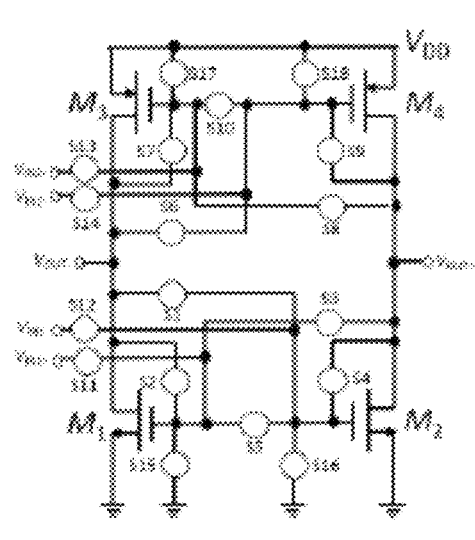
Figures 5A, 5B, 5C, 5D:
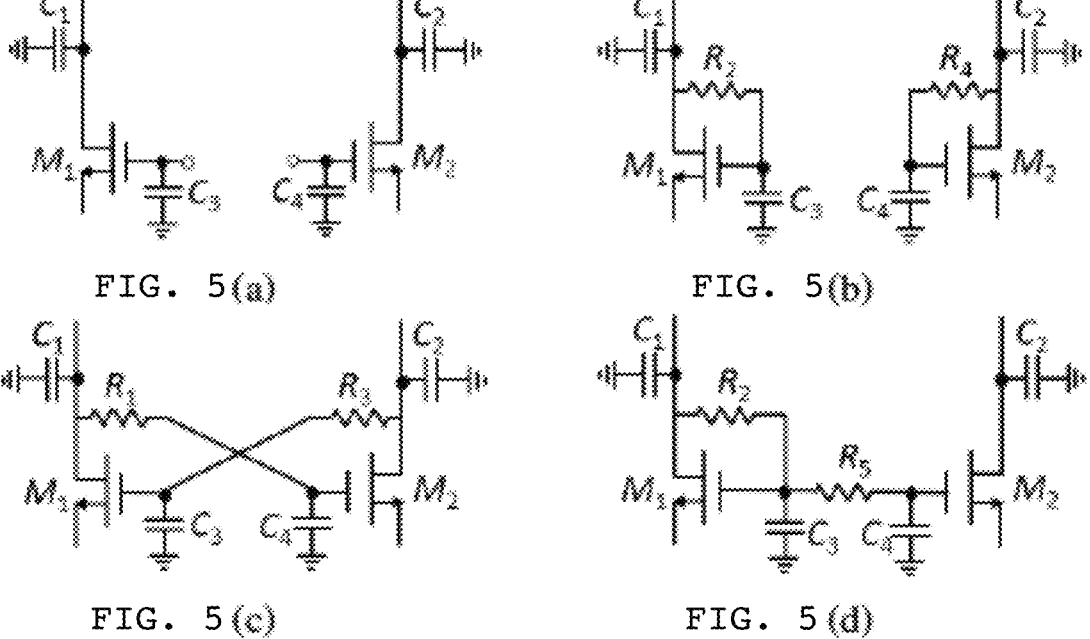
FIGS. 5(a), (b), (c), and (d) show a parasitic impedance model of an NMOS transistor pair for configurations that include a differential input pair, a diode-connected pair, a regeneration loop, and a current mirror, respectively.

The architecture of the differential mode CAB (CAB1) is shown in FIG. 4(a), where switches S1 to S10 are used to configure the PMOS and NMOS transistor pairs into the four different configurations shown in FIGS. 3(a)-(d). The switch S11 is used for common-mode feedback (CMFB), while S12 and S13 are used to turn off the CAB completely. The schematic of a single-ended mode CAB is shown in FIG. 4(b), where switches S1 to S10 are used for the configuration of the topology, switches S11 to S14 are used to isolate the input, and switches S15 to S18 turn off the CAB. The programming of an individual CAB into an operational amplifier (op amp) with different loads, a dynamic latch, and a common source amplifier with different loads is provided through FIG. 7, Table I, where the ON/OFF state of each switch is listed.

2.2.3 Trade-Off Between Security and Performance

In this section, the effect on the performance of the CAB due to the routing switches is characterized. The switches allow for fine configuration of each CAB, which provides the FPAA with both greater reconfigurability and security as compared to a fixed circuit topology. However, the routing switches contribute parasitic capacitance to the internal nodes of a circuit, which degrades performance.

To address the effects of the routing switches on the circuit performance, a generic NMOS pair is configured to implement the four different circuits shown in FIGS. 3(a)-3(d). Using the annotation for switches S1 to S5 shown in FIGS. 2(a) and 2(b), the capacitance C1 and C2 shown in FIGS. 5(a)-5(d) represent the aggregate parasitic capacitance from the drain terminal of switches S1, S2 and S3, S4, respectively. Capacitance C3 represents the parasitic capacitance from the source terminal of switches S2 and S3, and the drain terminal of S5, while C4 represents the parasitic capacitance of the source terminal of S1, S4, and S5.

The on resistance of the corresponding switches is denoted as R1 to R5. Due to the parasitic impedances of the switches, the minimum time required to charge or discharge an internal node is longer. The NMOS switches, implemented in a 65 nm process, provide 150Ω of on-resistance when the W/L ratio of the transistor is set to 10 μm/130 nm. The extracted parasitic impedances from the physical layout include 38 fF of capacitance for each of C1 and C2, and approximately 41 fF of capacitance for each of C3 and C4. Since each CAB contains one reconfigurable NMOS pair and one reconfigurable PMOS pair, the parasitic impedance of the CAB is easily determined based on the configured topology. In addition, the utilization of a switch-less global interconnect network between CABs minimizes the parasitic impedance.

In order to characterize the performance of the CABs, an individual CAB is programmed to implement different analog circuits. Each programmed topology is compared to a baseline design of the circuit, where all the routing switches are removed. The schematic of a differential mode CAB is shown in FIG. 4(a), with a (W/L)1,2 ratio of 80 μm/130 nm and a (W/L)3,4 ratio of 98 μm/130 nm.

A comparison of the 3-dB bandwidth between a reconfigured implementation of an amplifier and a baseline design is provided through the results listed in FIG. 8, Table II. The postPEX simulation results indicate a maximum drop in the 3 dB bandwidth of around 3.84 GHz and minimum drop of around 2.3 GHz for the different amplifier topologies listed. The bandwidth for all configurations is greater than 0.8 GHz, although there is a significant drop in the 3-dB bandwidth as compared to the corresponding baseline topology.

2.3 Security of FPAA Fabric

In this section, the security of implementing a circuit on a single CAB and multiple CABs is evaluated. To fully extract a circuit implemented on an FPAA, the attacker must know the location of the activated CAB (s), the configuration of each activated CAB, and the corresponding key for each configured CAB. The security of a circuit implemented on the FPAA is improved by using multiple CABs, as a larger key space and corresponding number of circuit configurations are possible as compared to a single CAB design. The evaluation of the security vulnerabilities is based on attack scenarios with different levels of knowledge of the floorplan, architecture, and configuration principles of the FPAA fabric.

2.3.1. Security of a Single CAB

The first attack scenario considers the programming of a single CAB into a target analog circuit, while the rest of the CABs are turned off. Assuming the attacker has no prior knowledge of the FPAA, in order to identify the location of the activated CAB, the attacker must map the structure of the FPAA by delayering and imaging the IC while also gaining access to all I/O ports. If the I/O ports are protected or only one I/O port is available while the FPAA is in test mode, the attacker must then measure the output response of the seven I/O ports while in active mode to identify the location of the activated CAB. However, six CABs within the same column of the CAB matrix share the same input and output port, which implies that the adversary only knows the column in which the CAB is activated by probing the I/O ports. In addition, by activating dummy CABs within other columns of the array, the true location of the targeted CAB is easily obfuscated.

Due to the programmability of the individual CABs, the adversary is not able to easily determine the topology of the baseline design implemented on the FPAA fabric. As shown from the switch configurations listed in FIG. 7, Table I, CAB1 is reconfigured into different types of op amps. Since all the op amp configurations amplify the input signal and provide a certain amount of gain, measuring the response at the output does not reveal the internal configuration of the CAB.

Figure 6:
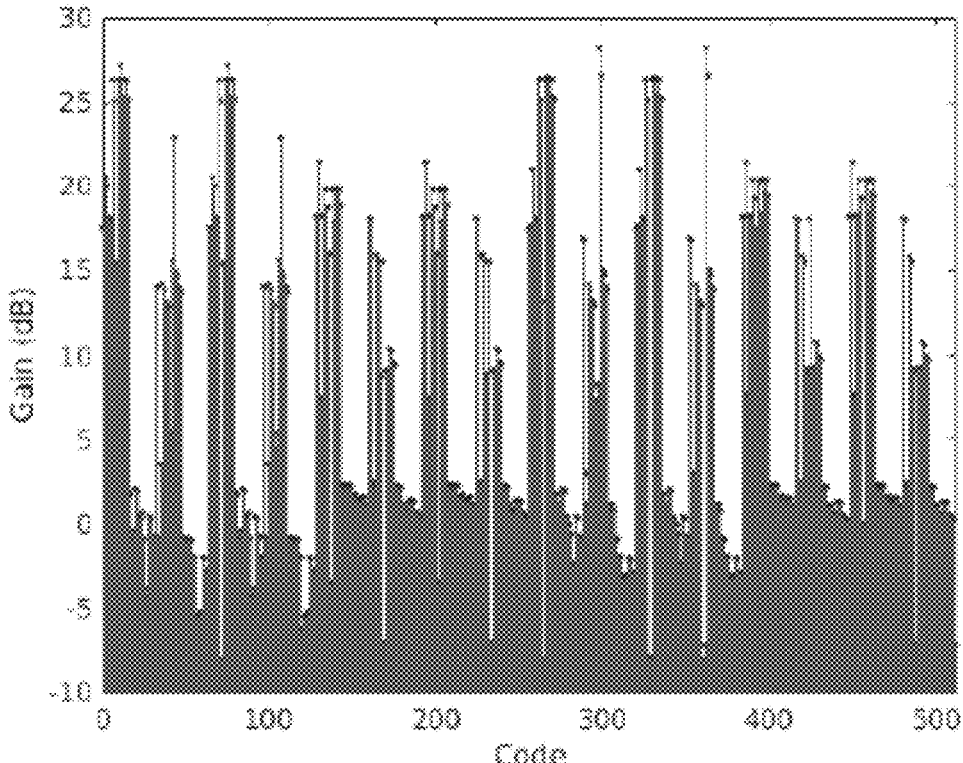
FIG. 6 shows a simulated gain with different configurations of CAB1.

The routing switches also prevent the attacker from using the raw unprotected FPAA fabric. Assuming the attacker knows the location of the activated CAB and the specifications of the targeted design, in order to extract the programming keys of the FPAA that implement a target baseline circuit design, the attacker must first access the key bits controlling the gates of the routing switches or delayer the IC and extract the raw netlist of the FPAA through reverse engineering. The FPAA is then treated as a black box, and the attacker measures or simulates the output response with different combinations of the programming key bitstream. The correct programming key is determined when the output response matches the expected specifications of the circuit Since each CAB1 includes 13 routing switches, the length of the key for CAB1 is 13 bits. The corresponding search space of finding the key is 213 for a single CAB1 unit when executing a brute force attack. Dissimilar from obfuscating the transistor sizes, where correlation between the key and the output response is used by the attacker to reduce the search space, the output responses of the randomly programmed CABs remain uncorrelated due to the different types of configured topologies that are possible, as shown from the gain of an amplifier in FIG. 6. The simulated results also indicate that multiple configurations produce similar gains due to keys that result in only slight differences in the implemented topologies. However, other circuit specifications including the DC operating point of each transistor or the feedback conditions differ. The error due to any mismatch in the topologies is also amplified when individual CABs are integrated into a larger circuit. Therefore, an adversary is not able to select a given topology by measuring only one parameter of a programmed circuit. For example, an op amp with or without common mode feedback (CMFB) produces similar gain; however, determining the correct key remains a challenge when other circuit properties or specifications are ignored.

2.3.2. Security of a Multi-CAB System

The implementation of more complex analog circuits is achieved by using multiple CABs distributed in different columns of the array and by using the global feedback network to configure closed loop systems. In order to attack a multiCAB system, the adversary must first determine the number of CABs being used. As indicated by the circuits listed in FIG. 9, Table III, a different number of CABs is required based on the analog circuit being implemented. Even assuming the number of used CABs and the location of the CABs distributed in the different columns of the CAB matrix are known by the attacker, the activated CAB (or CABs) in each column is masked by the other CABs of the column.

Implementing a multi-CAB circuit increases the difficulty In order to determine the functionality of the circuit, the attacker must also know the correct type of inputs to apply. For different analog circuits, the required inputs differ. For example, an amplifier or bandpass filter target input signals with different bandwidths, while a ring-oscillator does not require an input signal at all. The distinct specifications for the different circuits listed in Table III prevent an attacker from inferring the actual implementation of a circuit on the FPAA fabric. Even assuming the attacker determines the location of the activated CAB(s) and the specifications of the targeted design, the larger search space due to the larger number of programming key bits increases the security robustness.

In general, the programmability of the FPAA allows for circuits with significantly differing topologies, functionality, and specifications. Therefore, the target baseline circuit is obfuscated within the large set of topologies possible with the FPAA fabric.

2.4 Applying Attack on FPAA

In this section, the resilience of the FPAA to two different types of attacks is analyzed, with the assumption that the attacker possesses a certain level of knowledge of the FPAA fabric. The attack scenarios considered include a brute force attack and a topology attack.

2.4.1. Brute Force Attack

For a brute force attack, the adversary is assumed to possess access to the key nodes of the routing switches or the netlist of the FPAA fabric. In addition, the attacker must possess knowledge of the complete specification set of the target circuit, the location of the used CABs, and the correct output node to observe the response. If such knowledge of the implemented circuit is somehow gained, the attacker must then determine the correct bit stream by feeding in all combinations of programming keys and comparing the output response with the design specifications. The time complexity to solve for the key via brute force attack is exponentially dependent on the key space. The probability to extract circuits implemented on the FPAA fabric through brute force attack is listed in FIG. 10, Table IV. In general, the circuit that uses a greater number of CABs provides greater robustness against brute force attacks.

2.4.2. Topology Attack

Due to the structure of the FPAA fabric, where two transistors are programmed into four different configurations using five routing switches, the key search space is reduced by targeting only the four plausible configurations of the transistor pairs. The pseudocode for executing a topology attack on a single CAB1 is provided as FIG. 11, Algorithm 1. In order to correctly determine the key bits that set the routing switches, the attacker must first find all possible configurations of the transistor pair and the corresponding programming keys. A random configuration is then applied to each pair. For the CAB1 architecture shown in FIG. 4(*a*), the configuration of the NMOS transistor pair is chosen first, followed by the configuration of the PMOS transistor pair. If the resulting output matches the oracle output, the corresponding key is considered valid. Consider the CMFB switch, the key space of a single CAB is 25. Note, that the attacker is assumed to already know the location of the activated CAB, which implies that the key bits for switches S12 and S13 that are used to turn the CAB on and off are already known and, therefore, ignored. The probability to determine the multi-CAB circuits is also listed in Table IV, which, in addition to ignoring the switches that control the ON/OFF state of the CAB, also assumes that the key bits controlling the feedback network are known.

2.5 Conclusions

The use of an FPAA fabric as a security measure is described herein. A topology obfuscation technique is proposed to efficiently protect both differential mode and single-ended mode analog circuits. The security of implementing single and multi-CAB circuits on the FPAA fabric is evaluated. The implemented circuits include an op amp, a biquad filter, a ring oscillator, and a frequency divider. To attack a circuit implemented on the FPAA, the adversary must locate the activated CAB(s), determine the functionality of the used CAB(s), and decrypt the programming keys to configure the FPAA fabric, which is a significant challenge. In addition, a brute force attack and a topology attack are analyzed to evaluate the security of the FPAA, where an assumption is made that the attacker determines the location of the CAB(s) and that the keys that program the global feedback network are known. For a brute force attack, the search space to determine the key is 213 for single CAB design and at least 226 for a multi-CAB design. A multi-CAB implementation of an analog circuit on the FPAA provides robust security with a minimum search space of 210 key combinations for a topology attack and a maximum search space of 278 key combinations for a brute force attack.

While the invention has been described with reference to the embodiments above, a person of ordinary skill in the art would understand that various changes or modifications may be made thereto without departing from the scope of the claims.

The invention claimed is:

1. A field programmable analog array (FPAA) comprising at least one configurable analog block (CAB) that is fully programmable with no prior functionality before programming, wherein the CABs comprise connected rows in a matrix architecture connected through a fixed interconnect.

2. The FPAA of claim 1, wherein routing switches between different CABs are eliminated to address the bandwidth limitation of the overall system.

3. The FPAA of claim 1, wherein the FPAA is used to implement an op amp, continuous-time filter, ring-oscillator, and frequency divider.

4. The FPAA of claim 1, wherein the CAB is organized in a 6×6 CAB matrix architecture.

5. The FPAA of claim 4, wherein the CAB supports differential mode operation or single-ended operation.

6. The FPAA of claim 5, wherein the differential mode operation is implemented using one NMOS differential pair and one PMOS differential pair within the CAB, with each pair being reconfigurable via a set of routing switches.

7. The FPAA of claim 6, wherein the routing switches comprise switches configured between the gate and drain terminals of the transistor pairs to allow reconfiguration into a current mirror, diode-connected load, regeneration loop, or current source.

8. The FPAA of claim 1, wherein each CAB includes switches for selectively enabling or disabling positive or negative feedback within the CAB.

9. The FPAA of claim 1, further comprising a global feedback network that provides differential feedback between CABs across multiple columns in the matrix.

10. The FPAA of claim 9, wherein the global feedback network comprises two parallel switch-less interconnects for differential signal routing, a p-path and an n-path, to explicitly define polarity.

11. The FPAA of claim 1, wherein each CAB is configured to be fully inactive prior to programming and can be selectively powered down by connecting transistor gates to VDD or ground.

12. The FPAA of claim 1, wherein a synthesis tool is used to generate configuration data for the CABs, CAB biases, and feedback paths, which is compiled into a programming script.

13. The FPAA of claim 12, wherein the configuration data is stored using a row-major mapping of the CAB matrix and encoded using a Python-based interface.

14. The FPAA of claim 1, wherein the CABs are configured into a second-order biquad filter comprising four Gm cells, each mapped to a column of the CAB matrix.

15. The FPAA of claim 14, wherein the center frequency and gain of the biquad filter are tuned by modifying the configuration of specific CABs associated with the Gm cells.

16. The FPAA of claim 1, wherein the CABs are configured into a ring oscillator by programming a subset of CABs in a single row with diode-connected PMOS loads and establishing a feedback loop using the global feedback network.

17. The FPAA of claim 16, wherein the ring oscillator comprises between three and six CAB stages, selected based on a target oscillation frequency.

18. The FPAA of claim 1, wherein a pair of CABs is programmed as differential dynamic latches to form a frequency divider that outputs four signals with 90-degree phase shifts.

19. The FPAA of claim 18, wherein the frequency divider receives a clock signal on a transistor gate configured to toggle between a DC bias and an external input signal.

20. The FPAA of claim 1, wherein the CABs are implemented in a CMOS process with a switchless routing network to achieve an aggregate FPAA bandwidth greater than 0.8 GHz in reconfigured modes.

\* \* \* \* \*